United States Patent [19]

Kobatake

[11] Patent Number: 5,281,870
[45] Date of Patent: Jan. 25, 1994

[54] CURRENT CONTROLLER

[75] Inventor: Hiroyuki Kobatake, Tokyo, Japan

[73] Assignee: NEC Corporation, Tokyo, Japan

[21] Appl. No.: 843,553

[22] Filed: Feb. 28, 1992

[30] Foreign Application Priority Data

Feb. 28, 1991 [JP] Japan .................................. 3-034310

[51] Int. Cl.$^5$ ............................................ H03K 17/16
[52] U.S. Cl. .................... 307/451; 307/228; 307/263; 307/572; 307/576
[58] Field of Search ............... 307/448, 451, 228, 263, 307/572, 576

[56] References Cited

U.S. PATENT DOCUMENTS

| | | | |
|---|---|---|---|
| 4,897,559 | 1/1990 | Ho | 307/269 |
| 5,068,553 | 11/1991 | Love | 307/605 |
| 5,120,992 | 6/1992 | Miller et al. | 307/451 |
| 5,120,999 | 6/1992 | Schreck et al. | 307/451 |
| 5,140,194 | 8/1992 | Okitakan | 307/451 |

FOREIGN PATENT DOCUMENTS

| | | | |
|---|---|---|---|
| 0053955 | 4/1979 | Japan | 307/263 |
| 2163589 | 7/1985 | United Kingdom . | |

OTHER PUBLICATIONS

Unexamined Applications published by the Japanese Government. Title Patent Abstracts of Japan, issued Jan. 29, 1990, Abstract No: 1-276402(A) entitled "Magnetic Recording and Reproducing Device".

Primary Examiner—Margaret R. Wambach
Attorney, Agent, or Firm—Whitham & Marhoefer

[57] ABSTRACT

A current controller includes a first MOSFET of P type connected at a drain to a first node, at a gate to the input terminal and at a source to a power supply, a second MOSFET of N type connected at a drain to the first node via a first resistor, at a gate to the input terminal and at a source to ground, a third MOSFET of N type connected at a drain to the output terminal, at a gate to the first node via a second resistor and at a source to ground, and a capacitor connected between the gate of the third MOSFET and the power supply. The first and second resistors and the capacitor are set so that the maximum changing rates of rising and falling currents supplied from the output terminal through the third MOSFET are equalized. Therefore, levels of low level data are equalized between the positive and negative sides.

4 Claims, 8 Drawing Sheets

CURRENT CONTROLLER

FIELD OF THE INVENTION

This invention relates to a current controller, and more particularly to, a current controller used for a magnetic head of a tape recorder.

BACKGROUND OF THE INVENTION

A tape recorder includes a magnetic head, a switch connected to a power supply for applying a predetermined voltage to the magnetic head, and a current control circuit for controlling the amount of current flowing through the magnetic head.

The current control circuit includes a p-MOSFET connected at a drain to a first node, at a gate to an input terminal and at a source to a power supply, an n-MOSFET connected at a drain to the first node, at a gate to the input terminal and at a source to ground, an n-MOSFET connected at a drain to an output terminal, at a gate to a second node and at a source to ground, a resistor connected between the first node and the second node, and a capacitor connected between the second node and ground.

In operation, when the switch is turned on or off, current flowing through the magnetic head is rapidly changed to be increased or decreased between zero level and the maximum level, so that the magnetic field change occurs in the magnetic head to record the change into a magnetic tape. On the other hand, the current is gradually changed to be increased or decreased between the maximum level and zero level by controlling of the current controller, so that magnetic data is recorded from the magnetic head into the magnetic tape. That is, digital data having a level corresponding to a changing rate of the current flowing through the magnetic head is recorded on the magnetic tape.

In a reproducing mode, a reproducing circuit has positive and negative threshold levels for detecting a recorded data. The positive and negative threshold levels are set to be intermediate values between high level data and low level data on the positive and negative sides, respectively. The magnetic head detects the magnetic data of the magnetic tape which is then compared with the threshold levels in the reproducing circuit.

According to the conventional current control circuit, however there are disadvantages in that the threshold levels of the magnetic data reproduction are different between the positive and negative sides, because the absolute values of the low level data are different between the positive and negative sides because the changing rates of currents flowing through the magnetic head are different between the positive and negative sides due to a circuit structure of the current controller. This will be explained in more detail later. Therefore, noise margins become different between the positive and negative sides, so that operation of the magnetic data reproduction is unstable. Further, the reproducing circuit must be provided with two different detectors each having a different threshold level for detecting a corresponding side of positive and negative levels, so that the structure of the reproducing circuit including the magnetic head becomes complicated.

Otherwise, it is possible that the threshold levels of the magnetic head are set to be the same level, if a resistance of a resistor and a capacitance of a capacitor are set to be sufficiently high in the current controller to equalize the current changing rates on the positive and negative sides. However, a large space is necessary for the large resistor and the large capacitor, so that the current control circuit is difficult to be fabricated compactly.

SUMMARY OF THE INVENTION

Accordingly, it is an object of the invention to provide a current controller having the same current changing rate on the positive and negative sides to make it possible to have the same positive and negative threshold level for a reproducing operation.

It is another object of the invention to provide a current controller which can be fabricated compactly.

According to the invention, a current controller includes:

a first MOSFET of first conductive type connected at a drain to a first node, at a gate to an input terminal and at a source to a first power supply terminal;

a second MOSFET of second conductive type connected at a drain to the first node via a first resistor, at a gate to the input terminal and at a source to a second power supply terminal;

a third MOSFET of the second conductive type connected at a drain to an output terminal, at a gate to the first node via a second resistor and at a source to the second power supply terminal; and a capacitor connected between the gate of the third MOSFET and the second power supply terminal;

wherein the first and second resistors and the capacitor are set so that the maximum changing rates of rising and falling currents supplied from the output terminal through the third MOSFET are equalized.

BRIEF DESCRIPTION OF THE DRAWINGS

The invention will be explained in more detail in conjunction with the appended drawings; wherein.

DESCRIPTION OF THE PREFERRED EMBODIMENTS

Before describing a current control circuit according to the invention, the briefly aforementioned conventional tape recorder and the current control circuit will be explained in conjunction with FIGS. 1, 2 and 3.

Figure 1:
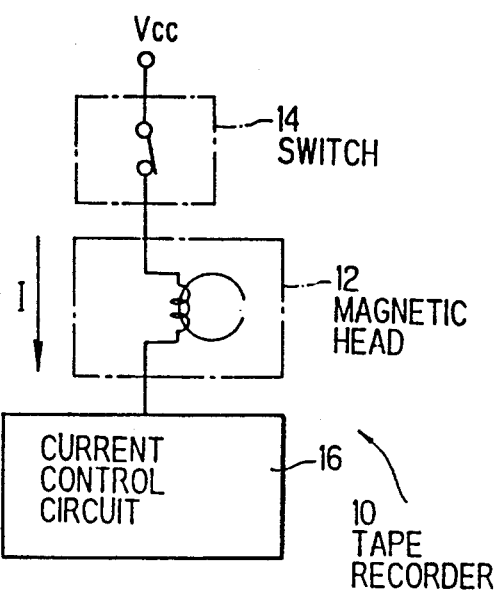
FIG. 1 is a block diagram showing a tape recorder.

FIG. 1 shows a tape recorder 10 of a general type for recording a predetermined digital data on a magnetic tape (not shown) and reproducing the recorded data from the magnetic tape. The tape recorder 10 includes a magnetic head 12, a switch 14 connected to a power supply $V_{cc}$ for applying a predetermined voltage to the magnetic head 12, and a current control circuit 16 for controlling current "I" flowing through the magnetic head 12.

Figure 2:
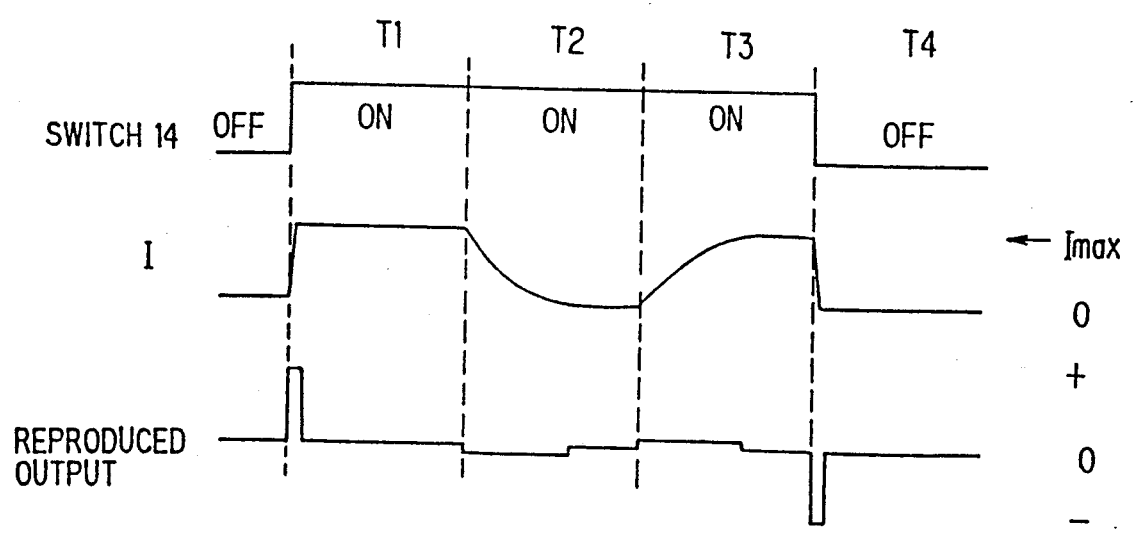
FIG. 2 is a timing chart showing operation of the tape recorder shown in FIG. 1.

FIG. 2 shows a timing chart of the tape recorder 10. When the switch 14 is turned on, the current "I" is rapidly increased from zero level to the maximum level $I_{max}$ at a time T1. Next, the current "I" is gradually decreased from the maximum level $I_{max}$ to zero level for a time T2. Next, the current "I" is gradually increased from zero level to the maximum level $I_{max}$ for a time T3. After that, when the switch 14 is turned off at a time T4, the current "I" is rapidly decreased from the maximum level $I_{max}$ to zero level.

In response to the change of the current "I", digital data having a level corresponding to a changing rate of the current "I" is recorded on the magnetic tape. In more detail, positive data of high level is recorded at the initial stage of the time T1, negative data of high level is recorded at the initial stage of the time T4, negative data of low level is recorded for the time T2, and positive data of low level is recorded for the time T3. In a reproducing mode, the recorded data is reproduced to be the same level as the recording level.

According to the tape recorder 10, the changing rate of the current "I" is changed by the current control circuit 16, so that it is possible that a voluntary data is recorded on a magnetic tape. And, the recorded data can be reproduced from the magnetic tape by detecting a level and polarity of the recorded data.

Figure 3:
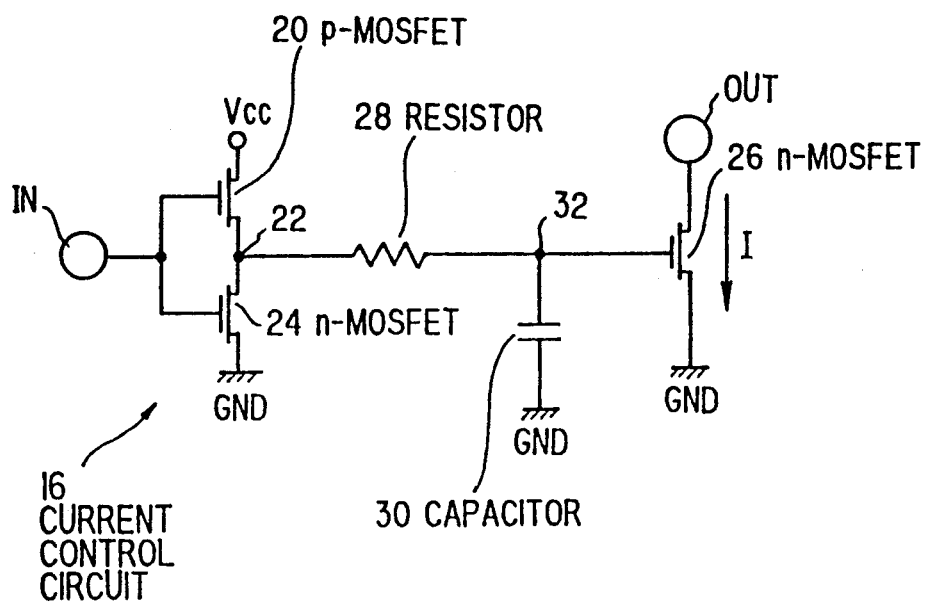
FIG. 3 is a circuit diagram showing a conventional current control circuit.

FIG. 3 shows the current control circuit 16 as mentioned above. The current control circuit 16 includes a p-MOSFET 20 connected at a drain to a first node 22, at a gate to an input terminal IN and at a source to a power supply $V_{CC}$, an n-MOSFET 24 connected at a drain to the first node 22, at a gate to the input terminal IN and at a source to ground GND, an n-MOSFET 26 connected at a drain to an output terminal OUT, at a gate to a second node 32, and at a source to ground GND, a resistor 28 connected between the first node 22 and the second node 32, and a capacitor 30 connected between the second node 32 and ground GND.

Figure 4A:
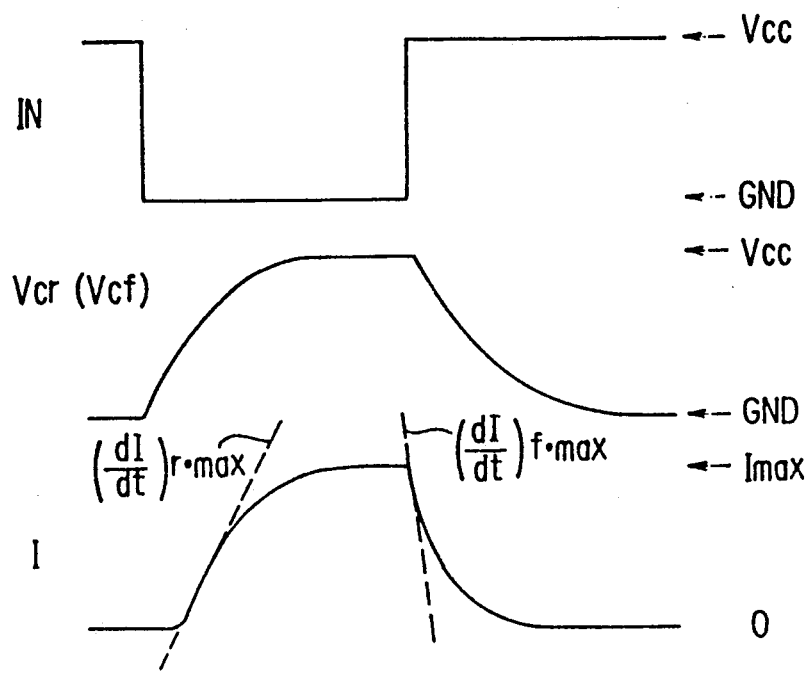
FIGS. 4A and 4B are timing charts showing operation of the conventional current control circuit, respectively.

Next, operation of the conventional current control circuit 16 will be explained in conjunction with FIG. 4A. When a voltage level at the input terminal IN changes from high to low, a voltage $V_{Cr}$ at the second node 32 that is a gate voltage of the n-MOSFET 26 is gradually increased. And, the voltage $V_{Cr}$ can be calculated by the below expression (1) on condition that a resistance R28 of the resistor 28 is sufficiently larger than an on-resistance of the p-MOSFET 20. In the expression (1), "C30" indicates a capacitance of the capacitor 30.

$$V_{Cr} = V_{CC}[1 - e^{(-t/c30 \cdot R28)}] \quad (1)$$

In this situation, current "I" flowing through the n-MOSFET 26 can be calculated by the below expressions (2a) and (2b) on condition that the n-MOSFET 26 is operating in a saturation region thereof. In this expressions (2a) and (2b), "$\beta_N$" indicates a gain constant of an n-MOSFET, and "$V_{TN}$" indicates a threshold voltage of an n-MOSFET.

$$I = 0: (V_{Cr} \leq V_{TN}) \quad (2a)$$

$$\begin{aligned} I &= (\beta_N/2)(V_{Cr} - V_{TN})^2: (V_{Cr} > V_{TN}) \\ &= (\beta_N/2)[V_{CC}(1 - e^{-t/c30 \cdot R28}) - V_{TN}]^2 \end{aligned} \quad (2b)$$

On the other hand, when voltage level at the input terminal IN changes from low to high, a voltage $V_{Cf}$ at the second node 32 that is the gate voltage of the n-MOSFET 26 is gradually decreased. And, the voltage $V_{Cf}$ can be calculated by the below expression (3) on condition that a resistance R28 of the resistor 28 is sufficiently larger than an on-resistance of the n-MOSFET 24.

$$V_{Cf} = V_{CC}(e^{-t/c30 \cdot R28}) \quad (3)$$

In this situation, the current "I" flowing through the n-MOSFET 26 can be calculated by the below expressions (4a) and (4b) on condition that the n-MOSFET 26 is operating in a saturation region thereof.

$$I = 0: (V_{Cf} \leq V_{TN}) \quad (4a)$$

$$\begin{aligned} I &= (\beta_N/2)(V_{Cf} - V_{TN})^2: (V_{Cf} > V_{TN}) \\ &= (\beta_N/2)[V_{CC}(e^{-t/c30 \cdot R28}) - V_{TN}]^2 \end{aligned} \quad (4b)$$

According to the conventional current control circuit 26, it may be realized that a changing rate (dI/dt) of the current "I" is set to be low at each side of positive and negative sides by setting value of the resistor 28 and the capacitor 30 to be high, respectively.

In accordance with the above expressions (2b) and (4b), the maximum changing rates "(dI/dt)r·max" in a gradually increasing state and "(dI/dt)f·max" in a gradually decreasing state of the current "I" can be calculated by the below expressions (5) and (6), respectively.

$$(dI/dt)r \cdot \max = (\beta_N/4 \cdot C30 \cdot R28)(V_{CC} - V_{TN})^2 \quad (5)$$

$$(dI/dt)f \cdot \max = (\beta_N \cdot V_{CC}(V_{CC} - V_{TN})/(C30 \cdot R28) \quad (6)$$

In addition, a ratio "R" of the absolute value of "(dI/dt)f·max" to "(dI/dt)r·max" can be calculated by the below expression (7).

$$\begin{aligned} R &= |(dI/dt)f \cdot \max|/(dI/dt)r \cdot \max \\ &= 4V_{CC}/(V_{CC} - V_{TN}) \end{aligned} \quad (7)$$

In the expression (7), for example, when $V_{CC}$ is 5V and $V_{TN}$ is 1 V, the ratio R becomes five. Then, in the reproducing mode, the absolute value of a low level $L_f$ at the positive side is a quintuplet of a low level $L_r$ at the negative side as shown in FIG. 4B.

Figure 4B:
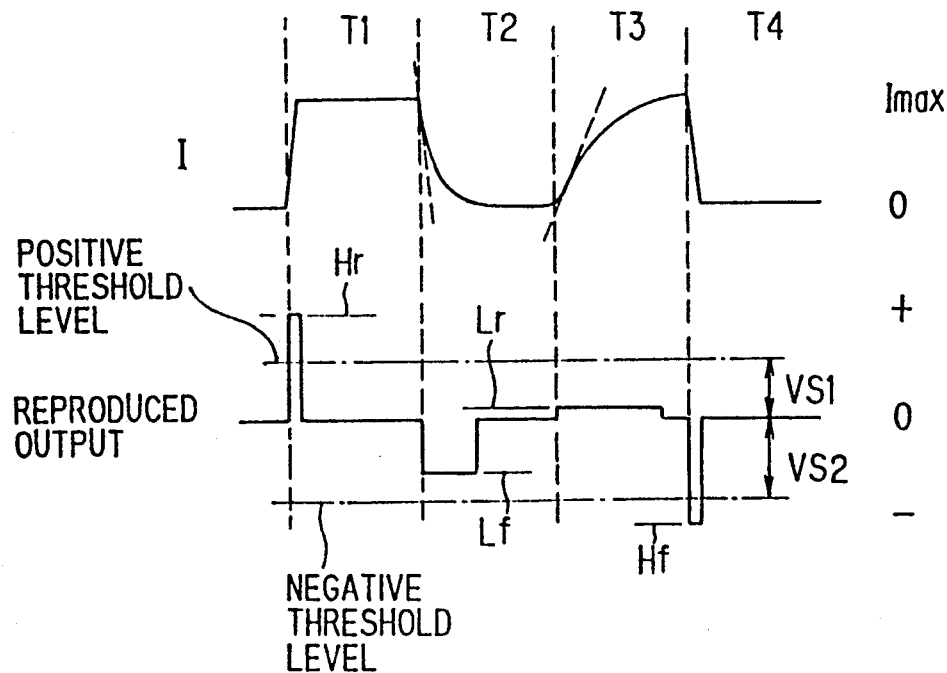

In the magnetic head 12, positive and negative threshold levels VS1 and VS2 are determined to be an intermediate value between a high level $H_r$ and the low level $L_r$, and between a high level $H_f$ and the low level $L_f$, respectively, as shown in FIG. 4B.

According to the conventional current control circuit 26, there are disadvantages in that the absolute values of the low level data $L_f$ and $L_r$ are different between the positive and negative sides, because the maximum changing rates "(dI/dt)f·max" and "(dI/dt)r·max" are largely different. Therefore, the threshold levels VS1 and VS2 are determined to be different values in the magnetic head 12, so that noise margins are different between the positive and negative sides. As a result operation of the magnetic head 12 becomes unstable. Further, it is necessary in a reproducing circuit to be provided with two different detectors each having a different detecting level for detecting a corresponding side of positive and negative data, so that structure of the reproducing circuit including the magnetic head 12 becomes complicated.

Otherwise, if the resistance of the resistor 28 and the capacitance of the capacitor 30 are set to be sufficiently high, it is possible that the threshold levels VS1 and VS2 are set to be the same level. However, the large resistor and the large capacitor necessitates large space, so that the current control circuit 16 is difficult to be fabricated compactly.

Figure 5:
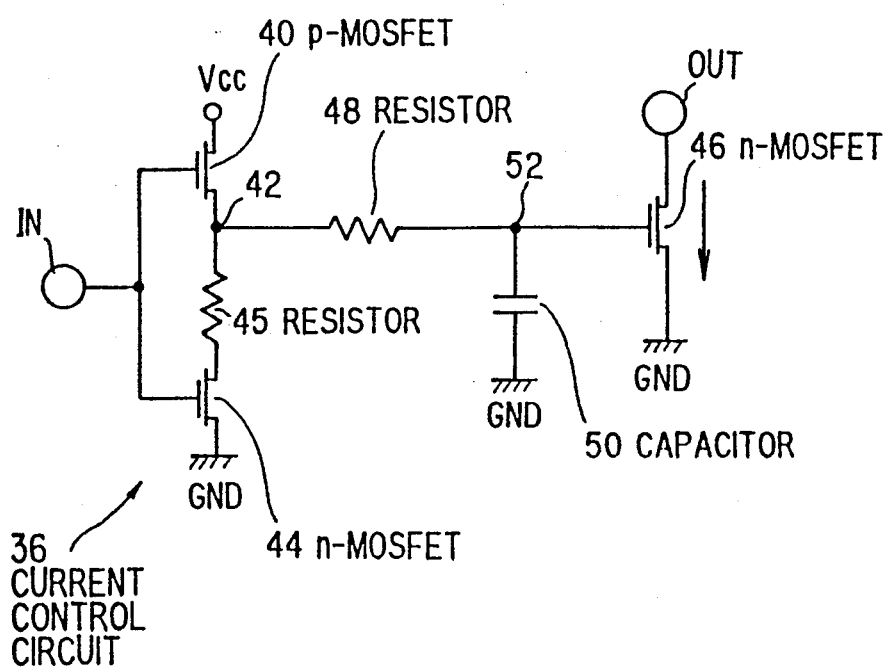
FIG. 5 is a circuit diagram showing a current control circuit of a first preferred embodiment according to the invention.

FIG. 5 shows a current control circuit 36 of a first preferred embodiment according to the invention. The current control circuit 36 includes a p-MOSFET 40 connected at a drain to a first node 42, at a gate to an input terminal IN and at a source to a power supply $V_{CC}$, an n-MOSFET 44 connected at a drain to the first node 42, at a gate to the input terminal IN and at a source to ground GND, a resistor 45 connected between the first connecting point 42 and the drain of the n-MOSFET 44, an n-MOSFET 46 connected at a drain to an output terminal OUT, at a gate to a second node 52 and at a source to ground GND, a resistor 48 connected between the first node 22 and the second node 52, and a capacitor 50 connected between the second node 52 and ground GND.

Figure 6A:
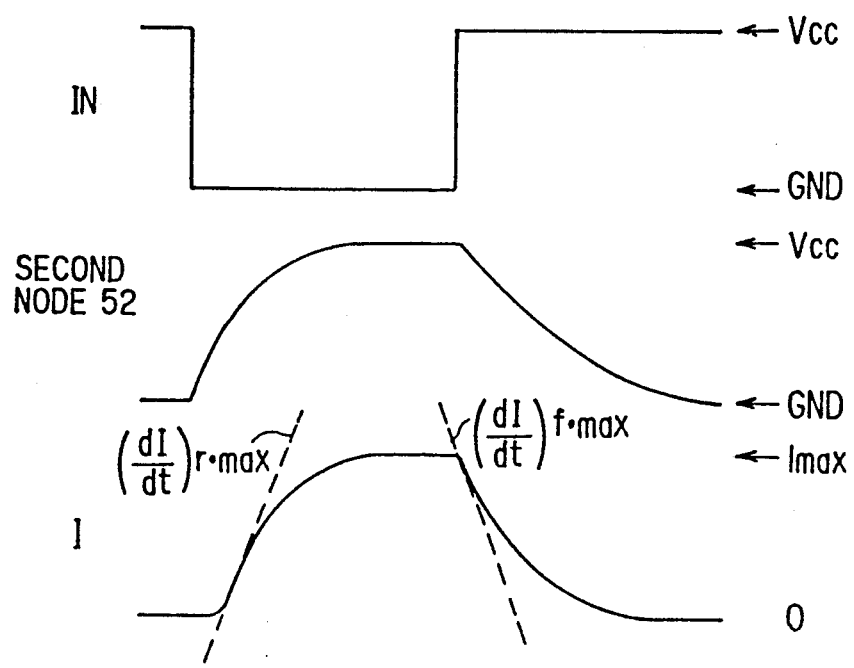
FIGS. 6A and 6B are timing charts showing operation of the first preferred embodiment, respectively.

Next, operation of the first preferred embodiment will be explained in conjunction with FIG. 6A. When a voltage level at the input terminal IN changes from high to low, a voltage $V_{Ar}$ at the second node 52 that is a gate voltage of the n-MOSFET 46 can be calculated by the below expression (8) on condition that a resistance R48 of the resistor 48 is sufficiently larger than an on-resistance of the p-MOSFET 40. In the expression (8), "C50" indicates a capacitance of the capacitor 50.

$$V_{Ar} = V_{CC}[1 - e^{(-t/c50 \cdot R48)}] \quad (8)$$

In this situation, current "I" flowing through the n-MOSFET 46 can be calculated by the below expressions (9a) and (9b) using a gain constant "$\beta_N$" of an n-MOSFET and a threshold voltage "$V_{TN}$" of an n-MOSFET, on condition that the n-MOSFET 46 is operating in a saturation region thereof.

$$I = 0: (V_{Ar} \leq V_{TN}) \quad (9a)$$

$$\begin{aligned}I &= (\beta_N/2)(V_{Ar} - V_{TN})^2: (V_{Ar} > V_{TN}) \\ &= (\beta_N/2)[V_{CC}(1 - e^{-t/c50 \cdot R48}) - V_{TN}]^2\end{aligned} \quad (9b)$$

On the other hand, when a voltage level at the input terminal IN changes from low to high, a voltage $V_{Af}$ at the second node 52 that is the gate voltage of the n-MOSFET 46 can be calculated by the below expression (10) on condition that a total resistance R45+R48 of the resistors 45 and 48 is sufficiently larger than an on-resistance of the n-MOSFET 44.

$$V_{Af} = V_{CC}[e^{-t/c50(R45+R48)}] \quad (10)$$

In this situation, the current "I" flowing through the n-MOSFET 46 can be calculated by the below expressions (11a) and (11b) on condition that the n-MOSFET 46 is operating in a saturation region thereof.

$$I = 0: (V_{Af} \leq V_{TN}) \quad (11a)$$

$$\begin{aligned}I &= (\beta_N/2)(V_{Af} - V_{TN})^2: (V_{Af} > V_{TN}) \\ &= (\beta_N/2)[V_{CC}(e^{-t/c50(R45+R48)}) - V_{TN}]^2\end{aligned} \quad (11b)$$

According to the first preferred embodiment, the changing rate (dI/dt) of the current "I" can be determined to be low easily by controlling values of the resistors 45 and 48 and the capacitor 50, respectively.

In accordance with the above expressions (9b) and (11b), the maximum changing rates "(dI/dt)r·max" and "(dI/dt)f·max" of the current "I" can be calculated by the below expressions (12) and (13), respectively.

$$(dI/dt)r\cdot\max = (\beta_N/4 \cdot C50 \cdot R48)(V_{CC} - V_{TN})^2 \quad (12)$$

$$(dI/dt)f\cdot\max = -(\beta_N \cdot V_{CC})(V_{CC} - V_{TN})/C50(R45+R48) \quad (13)$$

In addition, a ratio "R" of the absolute value of "(dI/dt)f·max" to "(dI/dt)r·max" can be calculated by the below expression (14).

$$\begin{aligned}R &= |(dI/dt)f \cdot \max|/(dI/dt)r \cdot \max \\ &= 4V_{CC} \cdot R48/(R45 + R48)(V_{CC} - V_{TN})\end{aligned} \quad (14)$$

Figure 6B:
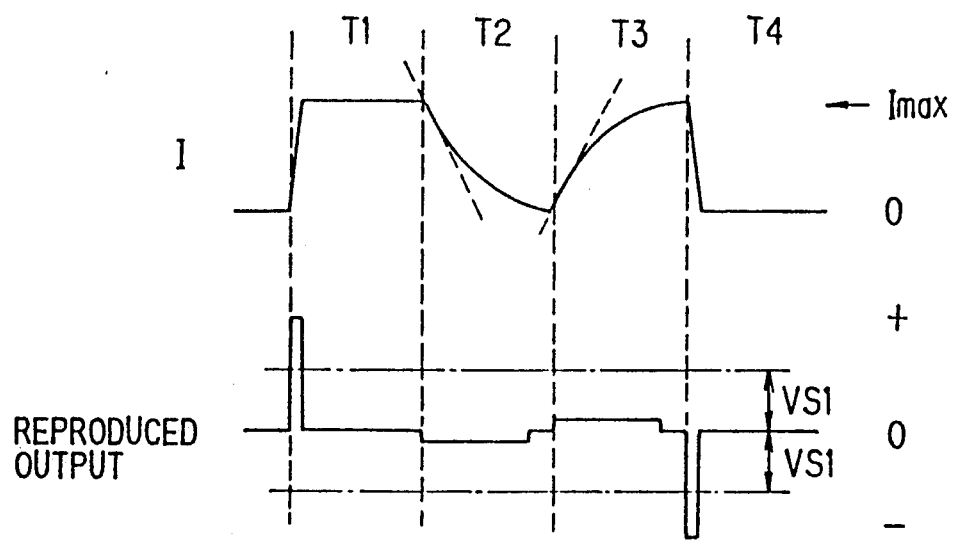

In the expression (14), when a voltage of the power supply $V_{CC}$ and a threshold voltage of an n-MOSFET $V_{TN}$ are assumed to be 5 V and 1 V, respectively, the ratio "R" can be determined to be "1" by determining the resistances R45 and R48 to meet an expression "R45=4·R48", respectively. Therefore, according to the first preferred embodiment, positive and negative threshold levels can be set to be at the same level VS1 as shown in FIG. 6B. As a result, the reproducing circuit operates stably, because noise margins become equal between the positive and negative sides.

In the current control circuit 36, even if the capacitor 50 is connected between the second node 52 and the power supply $V_{CC}$, the current control circuit 36 operates in the same manner as in the aforementioned circuit shown in FIG. 5.

Figure 7:
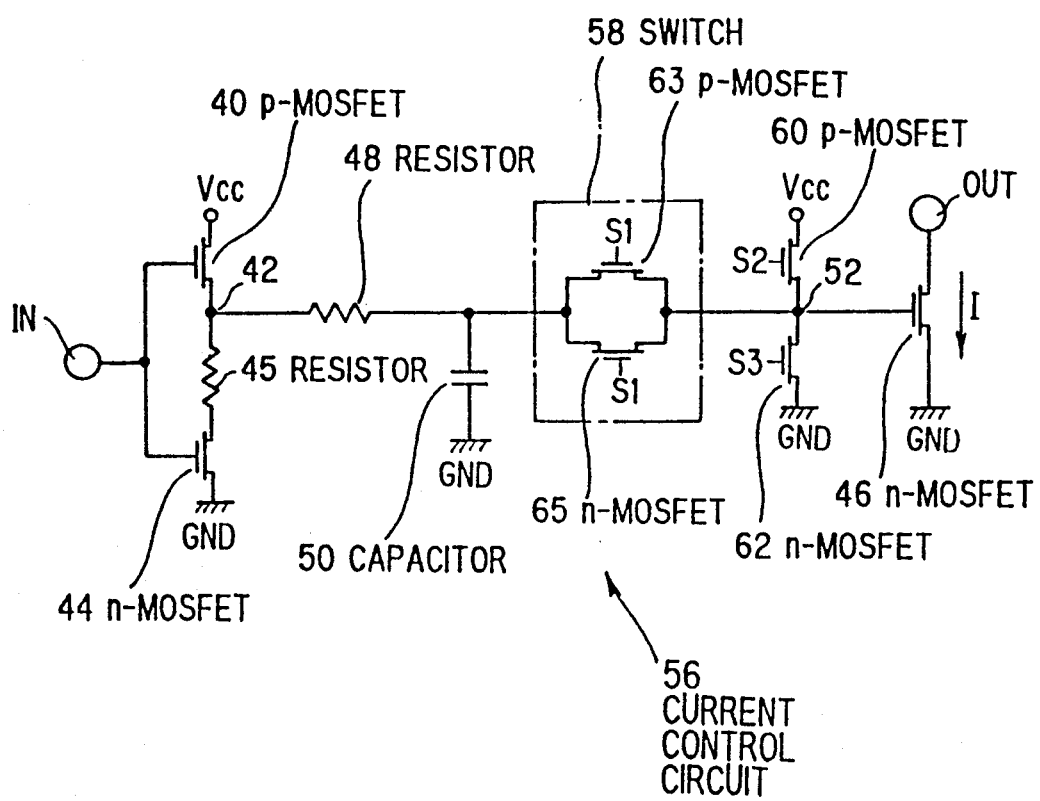
FIG. 7 is a circuit diagram showing a current control circuit of a second preferred embodiment according to the invention.

FIG. 7 shows a current control circuit 56 of a second preferred embodiment according to the invention. In the second preferred embodiment, explanation of structure corresponding to that of the first preferred embodiment is omitted.

The current control circuit 56 includes a switch 58 connected between a resistor 48 and a second node 52, a p-MOSFET 60 connected at a drain to the second node 52 and at a source to a power supply $V_{CC}$, and an n-MOSFET 62 connected at a drain to the second node 52 and at a source to ground GND.

The switch 58 includes an n-MOSFET 65 supplied at a gate with a control signal S1 and a p-MOSFET 63 supplied at a gate with an inverted signal $\overline{S1}$ of the signal S1. The p-MOSFET 60 and the n-MOSFET 62 are supplied at gates with control signals S2 and S3, respectively.

Figure 8:
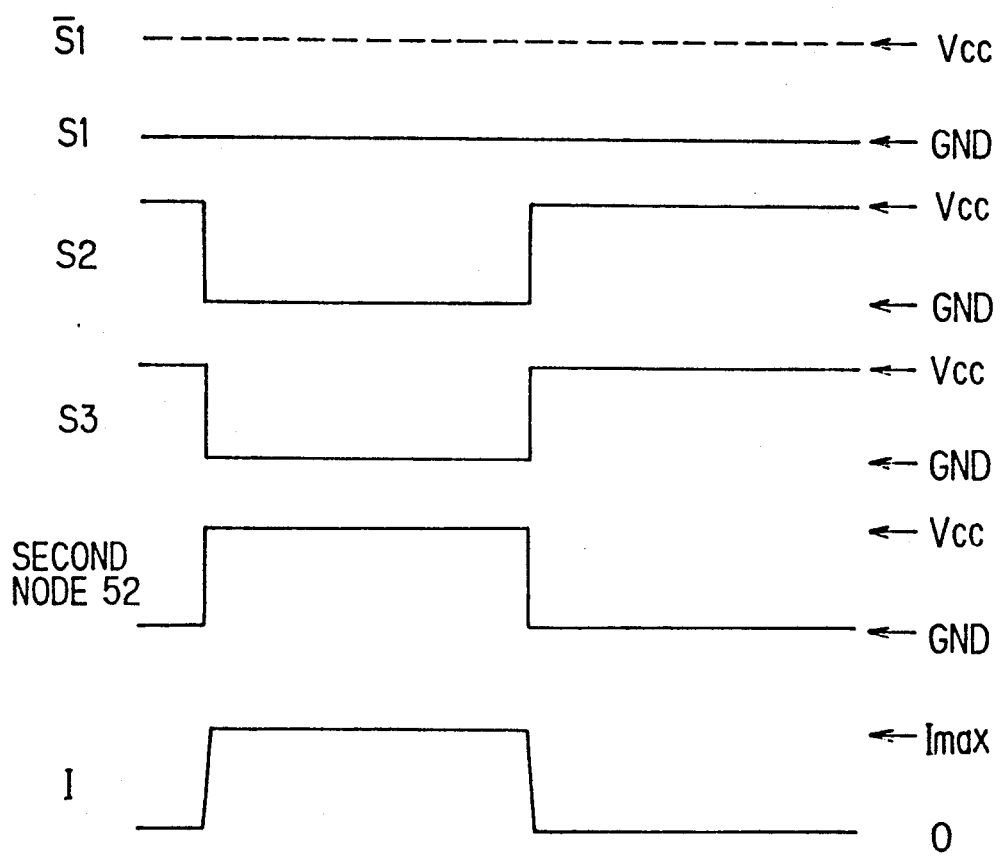
FIG. 8 is a timing chart showing operation of the second preferred embodiment.

Next, operation of the second preferred embodiment will be explained in conjunction with FIG. 8. When levels of the signals S2 and S3 change from high to low on condition that the signal S1 is set to a low level to keep the switch 58 to be in an OFF state, the p-MOSFET 60 becomes ON state and the n-MOSFET 62 becomes OFF state, so that a voltage level at the second node 52 changes from ground level (GND) to a power supply level ($V_{CC}$). Then, current "I" flowing through the n-MOSFET 46 rapidly changes from zero level to a maximum level $I_{max}$. On the other hand, when levels of the signals S2 and S3 change from low to high, the p-MOSFET 60 becomes OFF state and the n-MOSFET 62 becomes ON state, so that a voltage level at the second node 52 changes from power supply voltage level ($V_{CC}$) to ground level (GND). Then, the current "I" rapidly changes from the maximum level $I_{max}$ to zero level. Thus, high level data is recorded by the rapidly changing of the current "I" as shown at the time T1 and T4 in FIG. 6B.

When the signal S2 of high level and the signal S3 of low level are supplied to the gates of the p-MOSFET 60 and the n-MOSFET 62, respectively, on condition that the signal S1 is set to a high level to keep the switch 58 in the ON state, the p-MOSFET 60 and the n-MOSFET 62 become ON state. In this state, low level data of positive and negative sides are recorded on the magnetic tape in the same manner as the first preferred embodiment.

According to the second preferred embodiment, both low level data and high level data of positive and negative sides can be supplied. If high level data of positive side is not necessary, the p-MOSFET 60 can be omitted. And, if high level data of negative side is not necessary, the n-MOSFET 62 can be omitted.

Figure 9:
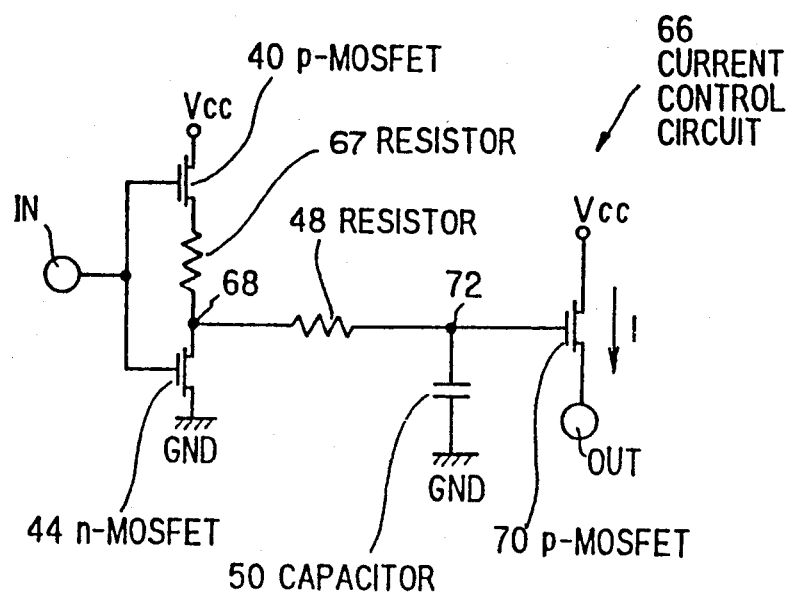
FIG. 9 is a circuit diagram showing a current control circuit of a third preferred embodiment according to the invention.

FIG. 9 shows a current control circuit 66 of a third preferred embodiment according to the invention. The current control circuit 66 has a much similar structure to the current control circuit 36 of the first preferred embodiment, so that explanation of corresponding components is omitted. The current control circuit 66 includes a resistor 67 connected between a first node 68 and a drain of a p-MOSFET 40, and a p-MOSFET 70 connected at a source to a power supply $V_{CC}$, at a drain to an output terminal OUT and at a gate to a second node 72.

Figure 10:
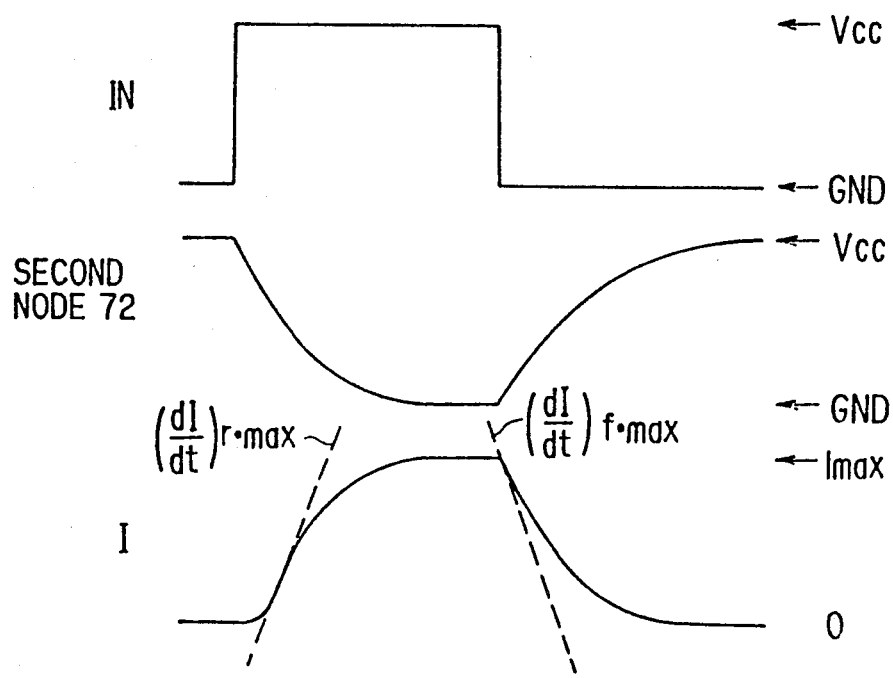
FIG. 10 is a timing chart showing operation of the third preferred embodiment.

Next, operation of the third preferred embodiment will be explained in conjunction with FIG. 10. When a voltage level at the input terminal IN changes from low to high on condition that a resistance R48 of a resistor 48 is sufficiently larger than an on-resistance of the n-MOSFET 44, a voltage $V_{Bf}$ at the second node 72 that is a gate voltage of the p-MOSFET 70 can be calculated by the below expression (16).

$$V_{Bf} = V_{CC}(e^{-t/c50 \cdot R48}) \qquad (16)$$

In this situation, current "I" flowing through the p-MOSFET 70 can be calculated by the below expressions (17a) and (17b) using a gain constant "$\beta_P$" of a p-MOSFET and a threshold voltage "$V_{TP}$" of a p-MOSFET, on condition that the p-MOSFET 70 is operating in a saturation region thereof. In the expressions, "$\beta_P$" indicates a gain constant of a p-MOSFET, and "$V_{TP}$" indicates a threshold voltage of a P-MOSFET.

$$I = 0: (V_{CC} - V_{Bf} \leq |V_{TP}|) \qquad (17a)$$

$$\begin{aligned} I &= (\beta_P/2)(V_{CC} - V_{Bf} - |V_{TP}|)^2 : (V_{CC} - V_{Bf}) > |V_{TP}| \\ &= (\beta_P/2)[V_{CC}(1 - e^{-t/c50 \cdot R48}) - |V_{TP}|]^2 \end{aligned} \qquad (17b)$$

On the other hand, when a voltage level at the input terminal IN changes from high to low on condition that a total resistance R67+R48 of the resistors 67 and 48 is sufficiently larger than an on-resistance of the p-MOSFET 40, a voltage $V_{Br}$ at the second node 72 that is the gate voltage of the p-MOSFET 70 can be calculated by the below expression (18).

$$V_{Br} = V_{CC}[1 - e^{-t/c50 (R67+R48)}] \qquad (18)$$

In this situation, the current "I" flowing through the p-MOSFET 70, on condition that the p-MOSFET 70 is operating in a saturation region thereof, can be calculated by the below expressions (19a) and (19b).

$$I = 0: (V_{CC} - V_{Br} \leq |V_{TP}|) \qquad (19a)$$

$$\begin{aligned} I &= (\beta_P/2)(V_{CC} - V_{Br} - |V_{TP}|)^2 : (V_{CC} - V_{Br}) > |V_{TP}| \\ &= (\beta_P/2)[V_{CC}(e^{-t/c50(R67+R48)}) - |V_{TP}|]^2 \end{aligned} \qquad (19b)$$

According to the third preferred embodiment, changing rate (dI/dt) of the current "I" can be determined to be low easily by controlling values of the resistors 67 and 48 and the capacitor 50, respectively.

In accordance with the above expressions (17b) and (19b), the maximum changing rates "(dI/dt)r·max" of positive side and "(dI/dt)f·max" of negative side of the current "I" can be calculated by the below expressions (20) and (21), respectively.

$$(dI/dt)r\cdot max = (\beta_P/4 \cdot C50 \cdot R48)(V_{CC} - |V_{TP}|)^2 \qquad (20)$$

$$(dI/dt)f\cdot max = -(\beta_P \cdot V_{CC})(V_{CC} - |V_{TP}|)/C50 \\ (R67+R48) \qquad (21)$$

In addition, a ratio "R" of the absolute value of "(dI/dt)f·max" to "(dI/dt)r·max" can be calculated by the below expression (22).

$$\begin{aligned} R &= |(dI/dt)f \cdot max|/(dI/dt)r \cdot max \\ &= 4V_{CC} \cdot R48/(R67 + R48)(V_{CC} - |V_{TP}|) \end{aligned} \qquad (22)$$

According to the third preferred embodiment, the maximum changing rate "(dI/dt)r·max" in a gradually increasing state and the maximum changing rate "(dI/dt)f·max" in a gradually decreasing state can be set to be the same value by controlling the resistances R67 and R48 so that the ratio "R" becomes 1.

Figure 11:
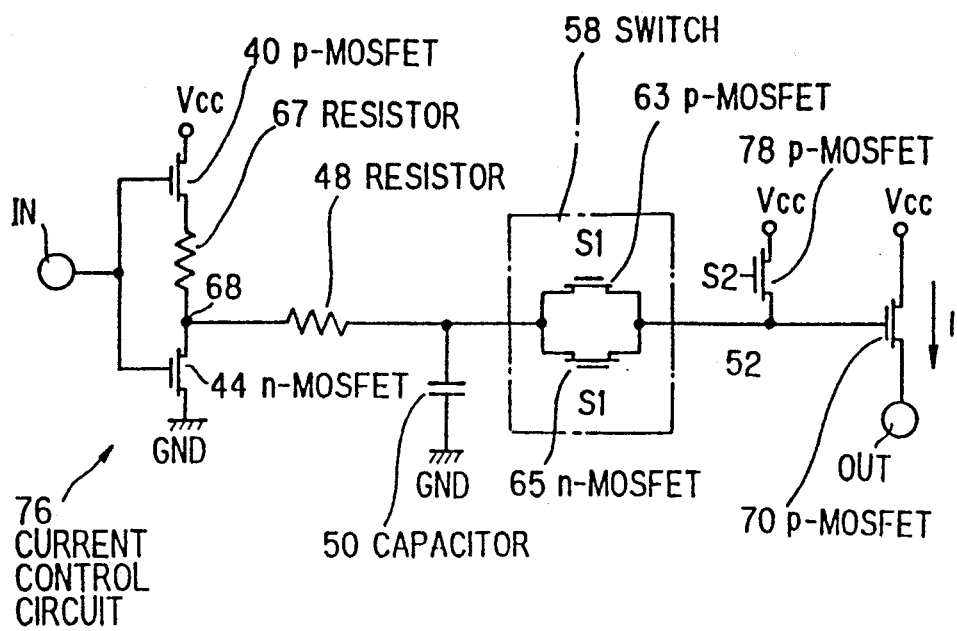
FIG. 11 is a circuit diagram showing a current control circuit of a fourth preferred embodiment according to the invention.

FIG. 11 shows a current control circuit 76 of a fourth preferred embodiment according to the invention. In the fourth preferred embodiment, explanation of structure corresponding to those of the second and third preferred embodiments is omitted.

The current control circuit 76 includes a switch 58 connected between a resistor 48 and a second node 52, and a p-MOSFET 78 connected at a drain to the second node 52 and at a source to a power supply $V_{CC}$. The p-MOSFET 78 is supplied at the gate with control signal S2.

Figure 12:
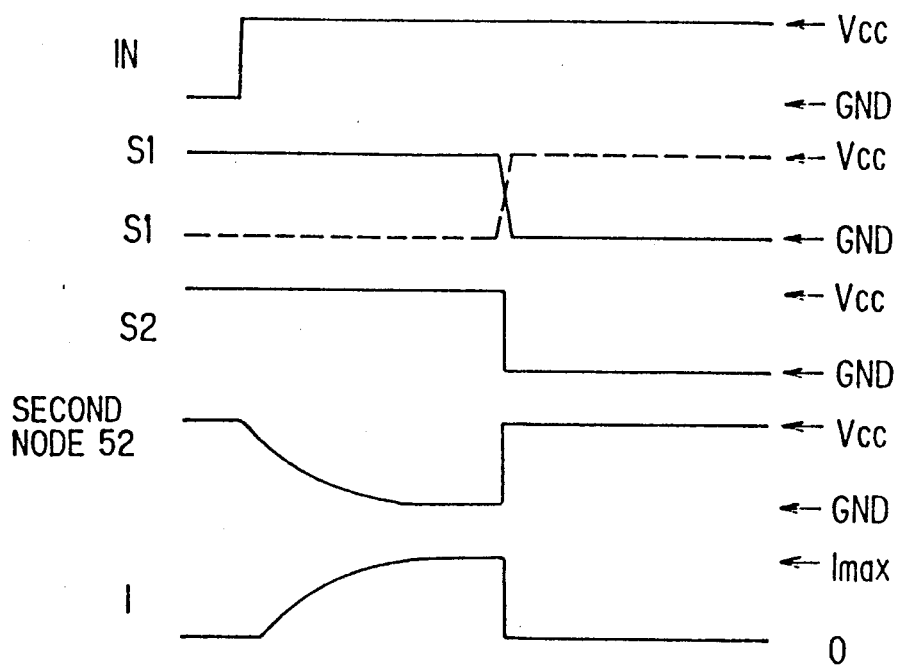
FIG. 12 is a timing chart showing operation of the fourth preferred embodiment.

Next, operation of the fourth preferred embodiment will be explained in conjunction with FIG. 12. When a voltage level at the input terminal IN changes from low to high on condition that the signal S1 is set to a high level for keeping the switch 58 in the ON state and the signal S2 of high level is supplied to the gate of the p-MOSFET 78, current "I" flowing through the p-MOSFET 70 is increased gradually. In the same manner, when a voltage level at the input terminal IN changes from high to low, the current "I" is decreased gradually.

On the other hand, when a level of the signal S2 changes from high to low on condition that the signal S1 is determined low level for keeping the switch 58 OFF state, the p-MOSFET 70 is turned ON state, so that a voltage level at the second node 52 rapidly changes from low to high. Then, the current "I" flowing through the p-MOSFET 70 changes rapidly from a maximum level $I_{max}$ to zero level. As a result, a high level data of negative side is supplied from the magnetic head 12 shown in FIG. 1.

Although the invention has been described with respect to specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A current controller, comprising:
   a first MOSFET of a first conductive type connected at a drain to a first node, at a gate to an input terminal and at a source to a first power supply terminal;
   a second MOSFET of a second conductive type connected at a drain to said first node via a first resistor, at a gate to said input terminal and at a source to a second power supply terminal;
   a third MOSFET of said second conductive type connected at a drain to an output terminal, at a gate to said first node via a second resistor and at a source to said second power supply terminal;
   a capacitor connected between said gate of said third MOSFET and said second power supply terminal; and
   a switching circuit connected between said gate of said third MOSFET and a common node of said second resistor and said capacitor;
   wherein said first and second resistors and said capacitor include means for equalizing maximum changing rates of rising and falling currents supplied from said output terminal through said third MOSFET.

2. A current controller, according to claim 1, wherein said switching circuit includes a p-MOSFET and an n-MOSFET.

3. A current controller, comprising:
   a first MOSFET of a first conductive type connected at a drain to a first node via a first resistor, at a gate to an input terminal and at a source to a first power supply terminal;
   a second MOSFET of a second conductive type connected at a drain to said first node, at a gate to said input terminal and at a source to a second power supply terminal;
   a third MOSFET of said second conductive type connected at a drain to an output terminal, at a gate to said first node via a second resistor and at a source to said second power supply terminal;
   a capacitor connected between said gate of said third MOSFET and said second power supply terminal; and
   a switching circuit connected between said gate of said third MOSFET and a common node of said second resistor and said capacitor;
   wherein said first and second resistors and said capacitor include means for equalizing maximum changing rates of rising and falling currents supplied from said output terminal through said third MOSFET.

4. A current controller, according to claim 3, wherein said switching circuit includes a p-MOSFET and an n-MOSFET.

* * * * *